United States Patent
Miura et al.

(10) Patent No.: US 11,128,104 B2
(45) Date of Patent: Sep. 21, 2021

(54) WAVELENGTH-TUNABLE LIGHT SOURCE AND WAVELENGTH CONTROL METHOD FOR THE SAME

(71) Applicant: Sumitomo Electric Industries, Ltd., Osaka (JP)

(72) Inventors: Tomoko Miura, Osaka (JP); Katsumi Uesaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 45 days.

(21) Appl. No.: 16/517,116

(22) Filed: Jul. 19, 2019

(65) Prior Publication Data

US 2020/0028326 A1    Jan. 23, 2020

(30) Foreign Application Priority Data

Jul. 19, 2018 (JP) .............................. JP2018-135964
Mar. 29, 2019 (JP) .............................. JP2019-067347

(51) Int. Cl.
*H01S 5/062* (2006.01)
*H01S 5/183* (2006.01)
*H01S 5/00* (2006.01)

(52) U.S. Cl.
CPC ........ *H01S 5/18302* (2013.01); *H01S 5/0622* (2013.01); *H01S 5/0057* (2013.01)

(58) Field of Classification Search
CPC .. H01S 5/18302; H01S 5/0622; H01S 5/0057; H01S 5/0617; H01S 5/1209; H01S 5/06258; H01S 5/062; H01S 5/00; H01S 5/06256

USPC ........................................ 372/20, 43.01, 36
See application file for complete search history.

(56) References Cited

U.S. PATENT DOCUMENTS

| | | | | |
|---|---|---|---|---|
| 6,323,990 | B1* | 11/2001 | Yamamoto | H01S 5/0687 359/328 |
| 8,902,938 | B2* | 12/2014 | Miura | H01S 5/0612 372/20 |
| 2005/0225825 | A1* | 10/2005 | Fraser | H01S 5/0687 359/238 |
| 2009/0022186 | A1* | 1/2009 | Tanaka | H01S 5/125 372/20 |
| 2009/0168817 | A1* | 7/2009 | Ishikawa | H01S 5/0687 372/20 |

(Continued)

FOREIGN PATENT DOCUMENTS

| JP | 2009-026996 A | 2/2009 |
|---|---|---|
| JP | 2011-108910 A | 6/2011 |
| JP | 2014-45172 A | 3/2014 |

*Primary Examiner* — Tuan N Nguyen
(74) *Attorney, Agent, or Firm* — Baker Botts L.L.P.; Michael A. Sartori

(57) ABSTRACT

A wavelength-tunable light source includes a wavelength-tunable laser including a first region and a second region each of which includes at least one of heaters, a frequency locker configured to receive output light of the wavelength-tunable laser and output two electric control signals whose phases are mutually different by 90° and having frequency period with respect to frequency of the output light, a thermal electric cooler on which the wavelength-tunable laser and the frequency locker are mounted, and a controller configured to control temperature of the heaters, and the thermal electric cooler on the basis of any one of the two electric control signals.

6 Claims, 11 Drawing Sheets

(56) References Cited

U.S. PATENT DOCUMENTS

| | | | |
|---|---|---|---|
| 2011/0116524 A1* | 5/2011 | Banno | H01S 5/06258 |
| | | | 372/38.02 |
| 2013/0070795 A1* | 3/2013 | Ikagawa | H01S 5/0687 |
| | | | 372/20 |
| 2017/0149209 A1* | 5/2017 | Uesaka | H01S 5/0656 |

* cited by examiner

Fig.4

| channel No. | 1 | 2 | ... | N-1 | N |
|---|---|---|---|---|---|
| reference frequency [Hz] | $f_0^{(1)}$ | $f_0^{(2)}$ | ... | $f_0^{(N-1)}$ | $f_0^{(N)}$ |
| reference temperature TEC [K] | $T_{ref}$ | $T_{ref}$ | ... | $T_{ref}$ | $T_{ref}$ |
| T-coefficient of osc. frequency of locker [K/Hz] | $C_{LOCK}^{(1)}$ | $C_{LOCK}^{(2)}$ | ... | $C_{LOCK}^{(N-1)}$ | $C_{LOCK}^{(N)}$ |
| T-coefficient of osc. frequency of t-LD [K/Hz] | $C_{LD}^{(1)}$ | $C_{LD}^{(2)}$ | ... | $C_{LD}^{(N-1)}$ | $C_{LD}^{(N)}$ |
| heater power (k=1 to 5) [W] | $P_k^{(1)}$ | $P_k^{(2)}$ | ... | $P_k^{(N-1)}$ | $P_k^{(N)}$ |
| λ-coefficient of heater power (k=1 to 5) [W/Hz] | $C_{HTk}^{(1)}$ | $C_{HTk}^{(2)}$ | ... | $C_{HTk}^{(N-1)}$ | $C_{HTk}^{(N)}$ |
| outputs of PD (m=1 to 3) [A] | $sPD_m^{(1)}$ | $sPD_m^{(2)}$ | ... | $sPD_m^{(N-1)}$ | $sPD_m^{(N)}$ |
| λ-coefficient of normalized PD outputs (m=1, 2) [1/Hz] | $C_{PDm}^{(1)}$ | $C_{PDm}^{(2)}$ | ... | $C_{PDm}^{(N-1)}$ | $C_{PDm}^{(N)}$ |

Fig.8

| channel No. | 1 | 2 | ... | N-1 | N |
|---|---|---|---|---|---|
| reference frequency [Hz] | $f_0^{(1)}$ | $f_0^{(2)}$ | ... | $f_0^{(N-1)}$ | $f_0^{(N)}$ |
| TEC temperature [K] | $T_{ref}^{(1)}$ | $T_{ref}^{(2)}$ | ... | $T_{ref}^{(N-1)}$ | $T_{ref}^{(N)}$ |
| ambient temperature [K] | $T_{CAL}^{(1)}$ | $T_{CAL}^{(2)}$ | ... | $T_{CAL}^{(N-1)}$ | $T_{CAL}^{(N)}$ |
| T-coefficient of osc. frequency of locker for TEC [K/Hz] | $C_{LOCK}^{(1)}$ | $C_{LOCK}^{(2)}$ | ... | $C_{LOCK}^{(N-1)}$ | $C_{LOCK}^{(N)}$ |
| T-coefficient of osc. frequency of locker for ambient-T [K/Hz] | $C_{LOCK\_AMB}^{(1)}$ | $C_{LOCK\_AMB}^{(2)}$ | ... | $C_{LOCK\_AMB}^{(N-1)}$ | $C_{LOCK\_AMB}^{(N)}$ |
| T-coefficient of osc. frequency of t-LD for TEC [K/Hz] | $C_{LD}^{(1)}$ | $C_{LD}^{(2)}$ | ... | $C_{LD}^{(N-1)}$ | $C_{LD}^{(N)}$ |
| T-coefficient of osc. frequency of t-LD for ambient-T [K/Hz] | $C_{LD\_AMB}^{(1)}$ | $C_{LD\_AMB}^{(2)}$ | ... | $C_{LD\_AMB}^{(N-1)}$ | $C_{LD\_AMB}^{(N)}$ |
| heater power (k=1 to 5) [W] | $P_k^{(1)}$ | $P_k^{(2)}$ | ... | $P_k^{(N-1)}$ | $P_k^{(N)}$ |
| wavelength coefficient of heater power (k=1 to 5) [W/Hz] | $C_{HTK}^{(1)}$ | $C_{HTK}^{(2)}$ | ... | $C_{HTK}^{(N-1)}$ | $C_{HTK}^{(N)}$ |
| reference outputs of photodiode (m=1 to 3) [A] | $sPD_m^{(1)}$ | $sPD_m^{(2)}$ | ... | $sPD_m^{(N-1)}$ | $sPD_m^{(N)}$ |
| λ-coefficient of normalized PD outputs (m=1, 2) [1/Hz] | $C_{PDm}^{(1)}$ | $C_{PDm}^{(2)}$ | ... | $C_{PDm}^{(N-1)}$ | $C_{PDm}^{(N)}$ |

WAVELENGTH-TUNABLE LIGHT SOURCE AND WAVELENGTH CONTROL METHOD FOR THE SAME

CROSS REFERENCE TO RELATED APPLICATION

This application claims the priority benefit of Japanese Applications No. JP2018-135964 filed on Jul. 19, 2018 and JP2019-067347 filed on Mar. 29, 2019, the entire contents of which are incorporated herein by references.

TECHNICAL FIELD

The present disclosure relates to a wavelength-tunable light source and a wavelength control method for the same.

BACKGROUND

For example, Japanese Unexamined Patent Publication No. 2009-26996 discloses a wavelength-tunable laser diode (t-LD: tunable Laser Diode) that can select output frequency.

In some cases, feedback control using a frequency locker is performed to control an oscillation frequency of a t-LD, which is a type of wavelength-tunable light source. The frequency locker includes optical components such as an etalon made of quartz, lenses, PDs (photodiodes). Conventionally, in a general form, a t-LD is mounted on a first thermal electric cooler (TEC) and a frequency locker is mounted on a second TEC. This is for the purpose of separating t-LD temperature setting for setting an oscillation frequency of a t-LD from etalon temperature setting for frequency locking of a frequency locker.

SUMMARY

A wavelength-tunable light source according to an aspect of the present disclosure includes: a wavelength-tunable laser including a first region and a second region each of which includes at least one of heaters, a frequency locker configured to receive output light of the wavelength-tunable laser and to output two electric control signals whose phases are mutually different by 90°, the two electric control signals having frequency period with respect to frequency of the output light, a thermal electric cooler on which the wavelength-tunable laser and the frequency locker are mounted, and a controller configured to control temperature of the heaters and the thermal electric cooler on a basis of any one of the two electric control signals.

BRIEF DESCRIPTION OF THE DRAWINGS

The foregoing and other purposes, aspects and advantages will be better understood from the following detailed description of a preferred embodiment of the disclosure with reference to the drawings, in which:

FIG. 4 is a table listing control data sets held on a LUT;

FIG. 8 is a table listing control data sets held on a LUT according to a modification;

DETAILED DESCRIPTION

Figure 1:
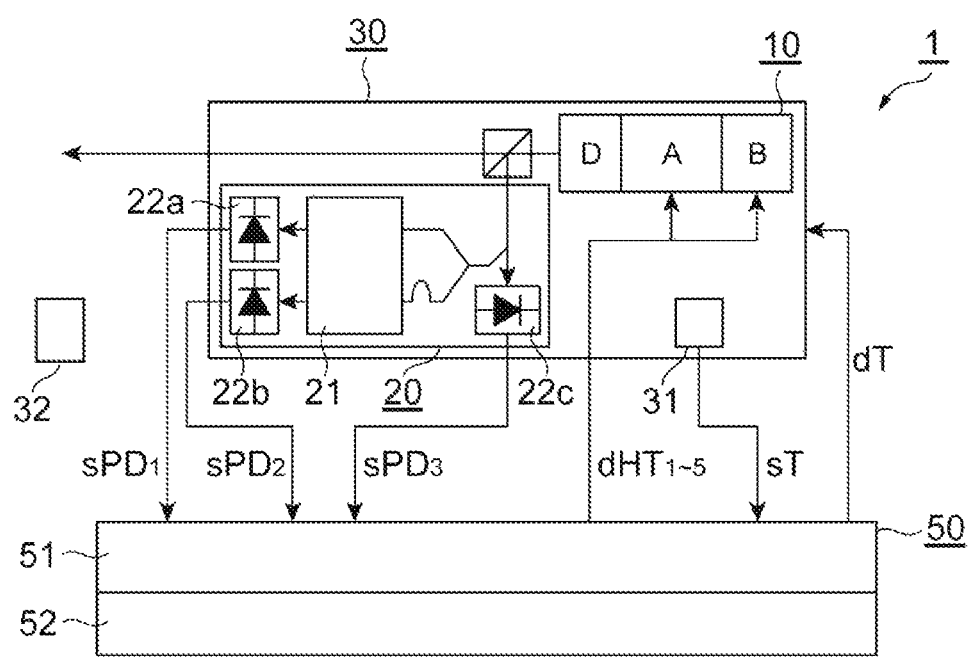
FIG. 1 is a schematic view of a t-LD device according to an embodiment.

Description of an Embodiment of the Present Disclosure

First, the content of an embodiment of the present disclosure is listed and described.

In recent years, there has been proposed an aspect in which a single TEC is used for setting the temperatures of the t-LD and the frequency locker. In this aspect, the temperature set to determine the locking property of the frequency locker varies the oscillation frequency of the t-LD. Therefore, when the temperature setting of the frequency locker is changed significantly, the oscillation frequency of the t-LD would be shifted significantly. Accordingly, in an aspect in which a single TEC is used unlike the conventional art, the time taken until the wavelength-tunable laser is stabilized at the target oscillation frequency becomes longer.

An embodiment of the present disclosure is a wavelength-tunable light source including: a wavelength-tunable laser including a first region and a second region each of which includes at least one of heaters; a frequency locker configured to receive output light of the wavelength-tunable laser and to output two electric control signals whose phases are mutually different by 90°, the two electric control signals having frequency period with respect to a frequency of the output light; a thermal electric cooler on which the wavelength-tunable laser and the frequency locker are mounted; and a controller configured to control temperatures of the heaters, and the thermal electric cooler on the basis of any one of the two electric control signals.

In the wavelength-tunable light source according to an embodiment, both the wavelength-tunable laser and the frequency locker are mounted on a single thermal electric cooler. Therefore, as compared with the case where the wavelength-tunable laser and the frequency locker are mounted on different thermal electric coolers, miniaturization can be reached. Moreover, the wavelength-tunable light source includes a controller that controls heaters included in the wavelength-tunable laser and a thermal electric cooler. Thus, when the temperature of the thermal electric cooler is changed to adjust the output of the frequency locker, it is possible to suppress a change in oscillation frequency of the wavelength-tunable laser through the use of the heaters. Accordingly, even when a single thermal electric cooler is used for the wavelength-tunable laser and the frequency locker, the time taken until the wavelength-tunable laser is stabilized at the target oscillation frequency can be shortened by correcting the heater power in accordance with the temperature change of the thermal electric cooler.

The frequency period of one of the two electric control signals and the frequency period of the other of the two electric control signals may be 50 GHz.

The controller may include a look-up table, the look-up table may include a plurality of reference frequencies and a control data set for each of the plurality of reference frequencies, each of the control data sets may include a setting temperature of a thermal electric cooler, a temperature coefficient of two electric control signals with respect to the temperature of the thermal electric cooler, a temperature coefficient of an oscillation frequency of a wavelength-tunable laser with respect to the temperature of the thermal electric cooler, power supplied to each of the heaters, a change rate of an oscillation frequency of the wavelength-tunable laser with respect to the power supplied to each of the heaters, and an output value for each of the two electric control signals. In this case, because the calculation time of the controller can be shortened, the time taken until the wavelength-tunable laser is stabilized at the target oscillation frequency can be shortened favorably.

Each of the control data sets may further include an ambient temperature of the wavelength-tunable light source at a time when the controller creates the look-up table, and a temperature coefficient of the two electric control signals with respect to the ambient temperature of the wavelength-tunable light source. Moreover, each of the control data sets may further include a temperature coefficient of the oscillation frequency of the wavelength-tunable laser with respect to the ambient temperature of the wavelength-tunable light source. In such cases, even when the precondition of the ambient temperature of the wavelength-tunable light source differs, the oscillation frequency of the wavelength-tunable laser can be stabilized.

The frequency locker may include a hybrid element formed of a semiconductor, and the hybrid element may be configured to output the two electric control signals. In this case, the frequency of the two electric control signals can easily be shifted through a change in temperature of the thermal electric cooler.

The first region may be an SG-DFB region and the second region may be a CSG-DBR region optically coupled to the SG-DFB region.

Another embodiment of the present disclosure is a wavelength control method for a wavelength-tunable light source including a wavelength-tunable laser including a first region and a second region each of which includes at least one of heaters, a frequency locker configured to receive output light of the wavelength-tunable laser and to output an electrical control signal having frequency period with respect to frequency of the output light, a thermal electric cooler on which the wavelength-tunable laser and the frequency locker are mounted, and a controller including a look-up table, the wavelength control method including acquiring a target oscillation frequency by a controller, selecting a reference frequency closest to the target oscillation frequency from among a plurality of reference frequencies pre-stored on a look-up table by a controller, calculating $\Delta f$ which is a difference between the target oscillation frequency and the reference frequency, calculating temperature $T_{NEW}$ of the thermal electric cooler such that a lock point of the output property of the frequency locker matches to the target oscillation frequency, setting and maintaining temperature of the thermal electric cooler to and at the temperature $T_{NEW}$, calculating a first power $P_k^{new}$ as an initial value such that the oscillation frequency of the wavelength-tunable laser matches to the target frequency, where k is a natural number, and supplying each of the heaters with the first power $P_k^{new}$.

When the first power $P_k^{new}$ are supplied to the corresponding heaters, at a point of time before feedback control is performed, the oscillation frequency of the wavelength-tunable laser can be brought closer to the target oscillation frequency. Thus, even when a single thermal electric cooler is used for the wavelength-tunable laser and the frequency locker, the time taken until the wavelength-tunable laser is stabilized at the target oscillation frequency can be shortened by correcting the heater power in accordance with the temperature change of the thermal electric cooler.

The value $T_{NEW}$ may be indicated by a formula: $T_{NEW}=T+\Delta f \times C_{LOCK}$ (where, T is temperature set in the thermal electric cooler at the reference frequency, and $C_{LOCK}$ is an inverse of a temperature coefficient of the electric control signal output from the frequency locker), and the first power $P_k^{new}$ may be indicated by a formula: $P_k^{new}=P_k+C_{HTk}\times(1-C_{LOCK}/C_{LD})\times\Delta f$ (where, $P_k$ is power supplied to a corresponding heater from among the heaters at the reference frequency, $C_{HTk}$ are inverses of a change rate of oscillation frequency of the wavelength-tunable laser with respect to the power supplied to the respective heaters, and $C_{LD}$ is an inverse of a change rate of the oscillation frequency of the wavelength-tunable laser which changes depending on a temperature change of the thermal electric cooler).

In the setting the temperature of the thermal electric cooler, a value obtained by adding $(T_{MON}-T_{CAL})/C_{LOCK\_AMB}$ from the value $T_{NEW}$ may be regarded as the temperature of the thermal electric cooler, and in the supplying each of the heaters with the initial value a value obtained by subtracting $C_{HTk}\times(T_{MON}-T_{CAL})/C_{LOCK\_AMB}$ from the first power $P_k^{new}$ may be regarded as the initial value (where, $T_{MON}$ is a current ambient temperature of the wavelength-tunable light source, $T_{CAL}$ is an ambient temperature of the wavelength-tunable light source at a time when the look-up table is created, and $C_{LOCK\_AMB}$ is an inverse of a change rate of the control signal output from the frequency locker with respect to the ambient temperature of the wavelength-tunable light source). In this case, even when the ambient temperature of the wavelength-tunable light source in operation (i.e., current ambient temperature of the wavelength-tunable light source) differs from the ambient temperature at a time when the look-up table is created, the oscillation frequency of the wavelength-tunable laser can be stabilized at or near a target oscillation frequency more reliably.

In the setting the temperature of the thermal electric cooler, a value obtained by adding $(T_{MON}-T_{CAL})/C_{LOCK\_AMB}$ from the value $T_{NEW}$ may be regarded as the temperature of the thermal electric cooler, and in the supplying each of the heaters with the initial value, a value obtained by subtracting $C_{HTk}\times(T_{MON}-T_{CAL})/C_{LOCK\_AMB}$ from the first power $P_k^{new}$ and adding $C_{HTk}\times(T_{MON}-T_{CAL})/C_{LD\_AMB}$ may be regarded as the initial value (where, $T_{MON}$ is a current ambient temperature of the wavelength-tunable light source, $T_{CAL}$ is an ambient temperature of the wavelength-tunable light source at a time when the look-up table is created, $C_{LOCK\_AMB}$ is an inverse of a change rate of the control signal output from the frequency locker with respect to the ambient temperature of the wavelength-tunable light source, and $C_{LD\_AMB}$ is an inverse of a temperature coefficient of the oscillation frequency of the wavelength-tunable laser with respect to the ambient temperature of the wavelength-tunable light source). In this case, even when the ambient temperature of the wavelength-tunable light source in operation (i.e., current ambient temperature of the wavelength-tunable light source) differs from the ambient temperature at a time when the look-up table is created, the oscillation frequency of the wavelength-tunable laser can be stabilized at or near a target oscillation frequency more reliably.

The electric control signals of the frequency locker may be two control signals whose phases are mutually different by 90° and that have frequency period with respect to the frequency of the output light of the wavelength-tunable laser, and the wavelength control method may further include selecting one of the two control signals corresponding to the reference frequency.

The wavelength control method may further include carrying out feedback control to the first power $P_k^{new}$ to converge the oscillation frequency of the wavelength-tunable laser with the target oscillation frequency. In this case, the oscillation frequency of the wavelength-tunable laser can be stabilized at a target oscillation frequency more reliably.

Description of an Embodiment of the Present Disclosure

The knowledge of the present disclosure can be easily understood with reference to the accompanying drawings illustrated as examples in consideration of the detailed description described below. Then, with reference to the accompanying drawings, an embodiment regarding a wavelength-tunable light source and a wavelength control method for the wavelength-tunable light source is described. Like parts are designated with like reference numerals when available.

FIG. 1 is a schematic view of a t-LD device according to the present embodiment. A t-LD device 1, which is one of wavelength-tunable light sources, includes a t-LD 10, a frequency locker 20, a TEC 30, and a controller 50.

The t-LD 10 is a light-emitting element including a plurality of heaters 19 (see FIG. 3 described later) for wavelength tuning. The frequency locker 20 is a member that receives output light of the t-LD 10 and outputs two electrical control signals whose phases are mutually different by 90° and each of which have frequency period with respect to the frequency of the output light. The frequency locker 20 includes a semiconductor 90° hybrid element (hereinafter simply the "hybrid element 21") and a plurality of light-receiving elements (PD: Photo Diode) 22a to 22c. The hybrid element 21 has a waveguide structure formed of a semiconductor. The t-LD 10 and the frequency locker 20 are mounted on the TEC 30. Therefore, the temperature setting of the t-LD 10 and the frequency locker 20 is carried out by the single TEC 30. The controller 50 is an integrated circuit connected to the t-LD 10, the TEC 30 and the frequency locker 20 (specifically, first to third PD 22a to 22c). The controller 50 controls the heaters 19 of the t-LD 10 and the TEC 30 on the basis of any one of the two control signals output from the frequency locker 20. For example, the controller 50 controls power supplied to each of the heaters 19. The controller 50 includes a processing device 51 and a storage device 52.

The hybrid element 21 branches light from the t-LD 10 (front light of the t-LD 10 in the present embodiment), causes the branched two light beams to interfere with each other after propagation in corresponding waveguides having different optical length, and causes the first PD 22a to receive the resulting interference light. Furthermore, the second PD 22b receives interference light having a phase difference of 90° with respect to the aforementioned interference light. Moreover, the third PD 22c receives pre-branched raw emission light, which is not influenced by the hybrid element 21, of the t-LD 10. The first PD 22a outputs a first signal (output value: $sPD_1$) depending on the received light intensity, the second PD 22b outputs a second signal (output value: $sPD_2$) depending on the received light intensity, and the third PD 22c outputs a third signal (output value: $sPD_3$) depending on the received light intensity. A ratio of the output of the first PD 22a to the third PD 22c (intensity ratio: $sPD_1/sPD_3$) and a ratio of the output of the second PD 22b to the third PD 22c (intensity ratio: $sPD_2/sPD_3$) are determined, and thus two interference spectra normalized by the hybrid element 21 can be obtained.

The interference spectra, i.e., the output of the first PD 22a and the output of the second PD 22b, which are normalized by the output of the third PD 22c respectively, indicate behavior of sine wave with respect to frequency. Then, the waveguide length in which the branched light propagates is set on the basis of phase delay of one of the branched light beams. For example, when optical path length difference of the two light signals (i.e., phase delay of one of the light beams) input to the hybrid element 21 is set to a predetermined value, the period of the sine wave can be set to or around 50 GHz. That is, the period of the two control signals output from the hybrid element 21 can be set to 50 GHz. In general, the period is defined as free spectral range (FSR). Moreover, 50 GHz is equivalent to a grid interval of a high-density frequency division multiplex system. The phase of the second signal output from the second PD 22b is shifted by 90° ($\pi/2$) with respect to that of the first signal output from the first PD 22a, i.e., 50/4=12.5 GHz.

Figure 2:
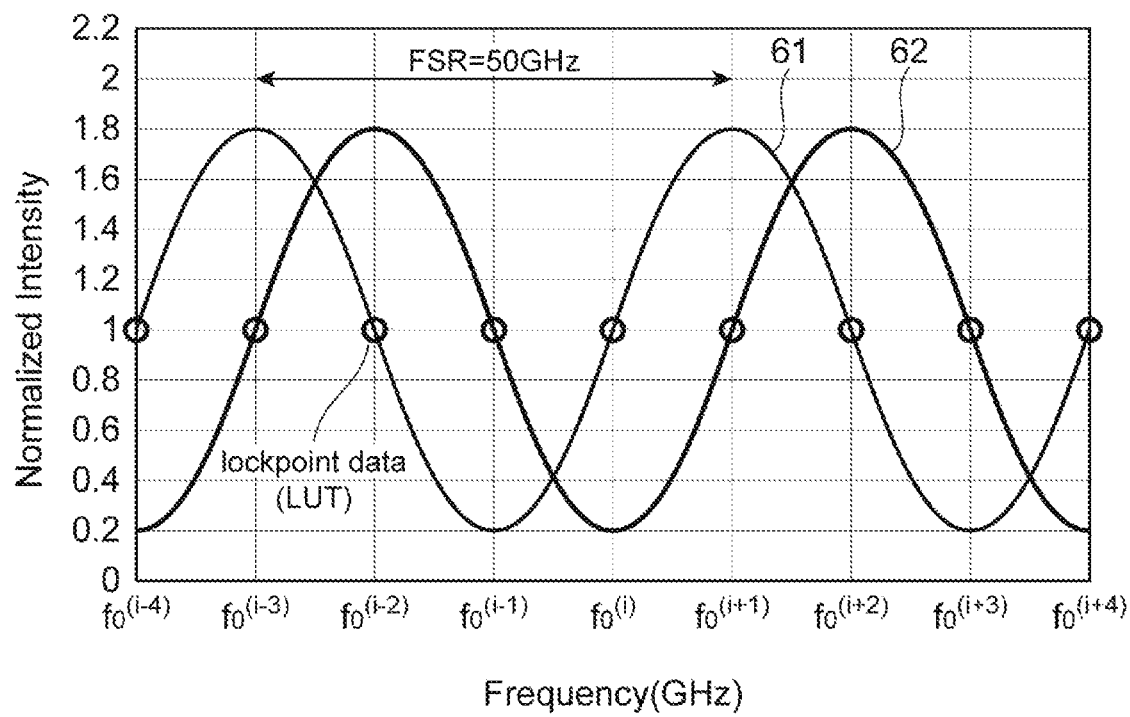
FIG. 2 is a graph illustrating an output property of a frequency locker according to an embodiment.

FIG. 2 is a graph illustrating an output property of the frequency locker according to the present embodiment. In FIG. 2, the horizontal axis indicates frequency and the vertical axis indicates normalized output (intensity ratio) of the first PD 22a and the second PD 22b. In FIG. 2, graph 61 indicates a signal output from the first PD 22a and graph 62 indicates a signal output from the second PD 22b. As illustrated in FIG. 2, with the t-LD device 1 according to the present embodiment, two electrical outputs (control signals) that are mutually different in phase by 90° are obtained. Therefore, the controller 50 can alternately perform feedback control on the t-LD 10 with regard to the two outputs. Thus, even when the single TEC 30 is used for the t-LD 10 and the frequency locker 20, the setting range of the temperature of the TEC 30 can be halved as compared with the aspect in which the frequency locker 20 only provides one output. Even when the target oscillation frequency of the t-LD device 1 is changed, the temperature change range of the TEC 30 can be set narrower. Accordingly, the time taken until the stable oscillation frequency of the t-LD 10 is provided at a new target oscillation frequency can be shortened.

According to the t-LD device 1, the frequency locker 20, specifically, the hybrid element including 90° hybrid element 21 including two waveguides having different optical length and using the waveguides for input, is formed of a semiconductor material. Therefore, the hybrid element 21 indicates a relatively larger temperature dependency as compared with a conventional etalon filter. This is because the linear expansion coefficient of the semiconductor material is likely to be larger than that of quartz which is typically used as a material for the conventional etalon filter. Thus, the hybrid element 21 indicating such a relatively large temperature dependency can obtain a desired output property with a relatively small temperature change. The temperature of the hybrid element 21 is controlled by the TEC 30. When the temperature of the hybrid element 21 is changed by the TEC 30, the oscillation frequency of the t-LD 10 mounted on the TEC 30 is also varied.

Here, in the case of the t-LD 10 according to the present embodiment, a change in oscillation frequency of the t-LD 10 due to a temperature change caused by the TEC 30 can be compensated by the heaters 19 integrated on the t-LD 10. Therefore, the t-LD device 1 including the single TEC 30 can be operated at a lower power consumption as compared with the aspect in which different TECs are prepared for the t-LD 10 and the frequency locker 20. In addition, as compared with the aforementioned aspect, a circuit that drives the TEC 30 can be miniaturized.

As illustrated in FIG. 1, the t-LD device 1 further includes temperature sensing elements 31 and 32. The temperature sensing element 31 is an element that senses the temperature of the TEC 30 and is mounted on the TEC 30. The temperature of the TEC 30 is, for example, a surface temperature of the TEC 30 on which the temperature sensing element 31 is mounted. The controller 50 receives monitor signal sT, which indicates the temperature of the TEC 30, from the temperature sensing element 31 so as to perform feedback control with respect to the TEC 30 such that a value corresponding to a target TEC temperature is obtained. The temperature sensing element 32 is an element that senses the ambient temperature of the t-LD device 1, which is a wavelength-tunable light source. The temperature sensing element 32 is provided inside or around the t-LD device 1. The controller 50 receives a monitor signal, which indicates the ambient temperature of the t-LD device 1, from the temperature sensing element 32.

Example 1

Figure 3:
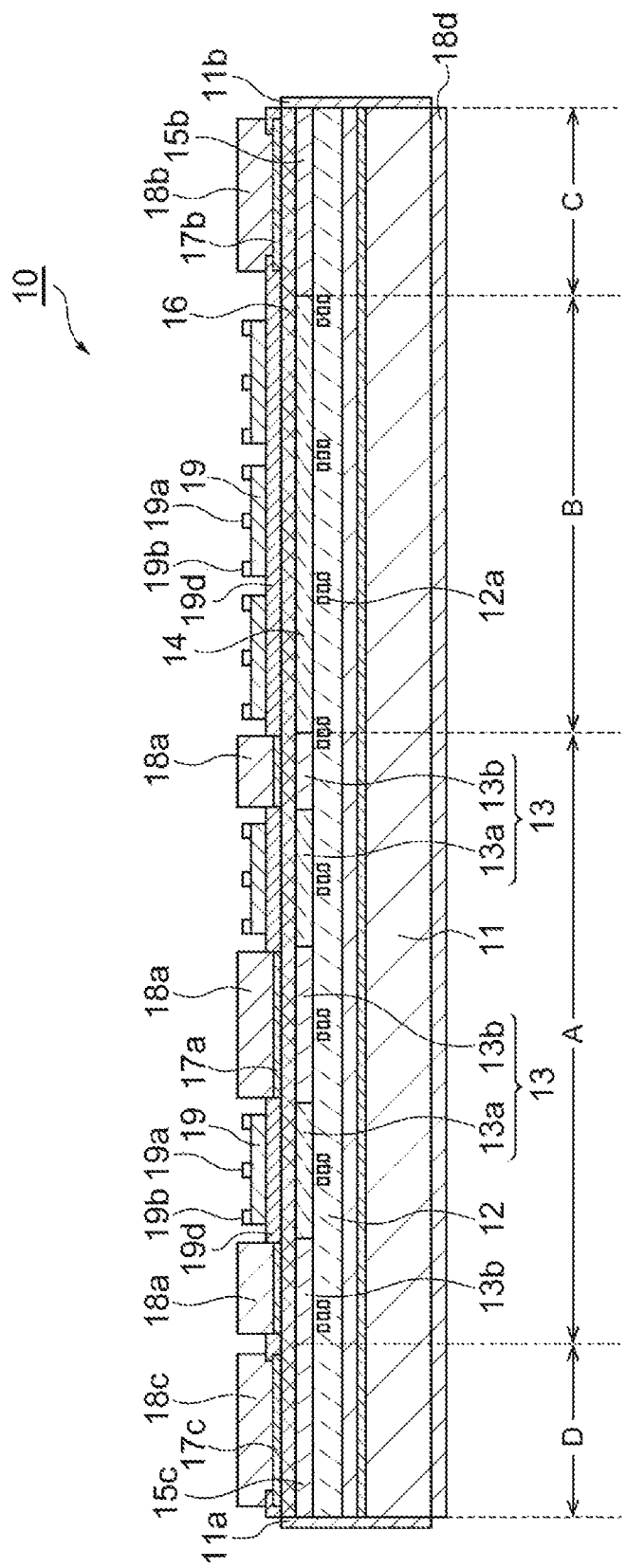
FIG. 3 is a schematic cross-sectional view of a t-LD that can be used for a t-LD device according to Example 1.

FIG. 3 is a schematic cross-sectional view of a t-LD that can be used for a t-LD device according to Example 1. The t-LD 10 includes an SG-DFB region A (Sampled Grating Distributed Feedback), a CSG-DBR region B (Chirped Sampled Grating Distributed Bragg Reflector), an SOA region D (Semiconductor Optical Amplifier), and an optical absorption region C. The SOA region D, the SG-DFB region A, the CSG-DBR region B, and the optical absorption region C are arranged in this order from the front side to the rear side. The SG-DFB region A has an optical gain and includes a sampled grating. The CSG-DBR region B does not have an optical gain and includes a chirped sampled grating. The SG-DFB region A is optically coupled to the CSG-DBR region B and the SOA region D. The CSG-DBR region B is optically coupled to the optical absorption region C in addition to the SG-DFB region A.

The SG-DFB region A has a structure in which, on a substrate 11, a lower cladding layer 12, an active layer 13, an upper cladding layer 16, a contact layer 17a, an electrode 18a, an insulation film 19d, and a plurality of heaters 19 (first heaters) are stacked in this order. The CSG-DBR region B has a structure in which, on the substrate 11, the lower cladding layer 12, an optical waveguide layer 14, the upper cladding layer 16, the insulation film 19d, and a plurality of heaters 19 (second heaters) are stacked. Each of the heaters 19 includes electrodes 19a and 19b. The SOA region D has a structure in which, on the substrate 11, the lower cladding layer 12, an optical amplification layer 15c, the upper cladding layer 16, a contact layer 17c, and an electrode 18c are stacked. The optical absorption region C has a structure in which, on the substrate 11, the lower cladding layer 12, an optical absorption layer 15b, the upper cladding layer 16, a contact layer 17b, and an electrode 18b are stacked. On the back surface of the substrate 11, a back-surface electrode 18d, which is common to the regions A to D, is provided.

According to the t-LD 10, the substrate 11, the lower cladding layer 12, and the upper cladding layer 16 are integrally formed in the regions A to D. The active layer 13, the optical waveguide layer 14, the optical absorption layer 15b, and the optical amplification layer 15c are formed on the same plane. That is, the lower sides of the active layer 13, the optical waveguide layer 14, the optical absorption layer 15b, and the optical amplification layer 15c correspond to the upper side of the lower cladding layer 12, which is integrally formed in the regions A to D. The interface between the SG-DFB region A and the CSG-DBR region B corresponds to the interface between the active layer 13 and the optical waveguide layer 14. An end surface film 11a is formed on an end surface of the SOA region D. In Example 1, the end surface film 11a is an anti-reflection (AR) film. The end surface film 11a functions as a front-side end surface of the t-LD 10. Meanwhile, an end surface film 11b is formed on an end surface of the optical absorption region C. In Example 1, the end surface film 11b is also an AR film. The end surface film 11b functions as a rear-side end surface of the t-LD 10.

The substrate 11 is, for example, an n-type InP substrate. The lower cladding layer 12 is, for example, an n-type InP layer, and the upper cladding layer 16 is, for example, p-type InP layer. The refractive index of the lower cladding layer 12 and the upper cladding layer 16 is smaller than the refractive index of the active layer 13, the optical waveguide layer 14, the optical absorption layer 15b, and the optical amplification layer 15c. Therefore, a light confinement structure is formed by the lower cladding layer 12 and the upper cladding layer 16.

The active layer 13 has a structure in which an optical modulation layer 13a having the heaters 19 at the uppermost and a light generation layer 13b having an optical gain are alternately arranged along the optical axis. The light generation layer 13b may include a quantum well structure, and has a structure in which a well layer including, for example, $Ga_{0.32}In_{0.68}As_{0.92}P_{0.08}$ (thickness: 5 nm) and a barrier layer including $Ga_{0.22}In_{0.78}As_{0.47}P_{0.53}$ (thickness: 10 nm) are alternately stacked. The electrode 18a is provided at the uppermost part of the light generation layer 13b.

The optical modulation layer 13a and the optical waveguide layer 14 can be formed, for example, of a bulk semiconductor layer, and are formed, for example, of $Ga_{0.22}In_{0.78}As_{0.47}P_{0.53}$. The optical modulation layer 13a and the optical waveguide layer 14 have an energy gap (Eg) larger than that of the light generation layer 13b.

The optical amplification layer 15c is a region that performs optical amplification by receiving an optical gain according to current injected from the electrode 18c. The optical amplification layer 15c may include, for example, a quantum well structure. The optical amplification layer 15c has a structure in which, for example, a well layer of $Ga_{0.35}In_{0.65}As_{0.99}P_{0.01}$ (thickness: 5 nm) and a barrier layer of $Ga_{0.15}In_{0.85}As_{0.32}P_{0.68}$ (thickness: 10 nm) are alternately stacked. Alternatively, the optical amplification layer 15c may be a bulk semiconductor including, for example, $Ga_{0.44}In_{0.56}As_{0.95}P_{0.05}$. The optical amplification layer 15c and the light generation layer 13b may be made of the same material.

The optical absorption layer 15b is a region that can shift (narrower) the energy gap of the fundamental absorption edge according to a bias applied to the electrode 18b. The optical absorption degree can be changed through shifting of the energy gap of the optical absorption layer 15b. The optical absorption layer 15b may include, for example, a quantum well structure. The optical absorption layer 15b has a structure in which, for example, a well layer of $Ga_{0.35}In_{0.65}As_{0.99}P_{0.01}$ (thickness: 5 nm) and a barrier layer of $Ga_{0.15}In_{0.85}As_{0.32}P_{0.68}$ (thickness: 10 nm) are alternately stacked. Alternatively, the optical absorption layer 15b may be a bulk semiconductor including, for example, $Ga_{0.44}In_{0.56}As_{0.95}P_{0.05}$. The optical absorption layer 15b and the light generation layer 13b may be made of the same material.

The contact layers 17a to 17c can be formed, for example, of a p-type $Ga_{0.47}In_{0.53}As$ crystal. The insulation film 19d is a protective film having, for example, a silicon nitride film (SiN) or a silicon oxide film (SiO). The heaters 19 are thin-film resistors made of titanium tungsten (TiW). Each of the heaters 19 may be formed across a plurality of segments of the CSG-DBR region B. The heaters 19 of the SG-DFB region A are formed on the optical modulation layer 13a.

The electrodes 18a to 18c, 19a and 19b are conductors made, for example, of gold (Au). The back-surface electrode 18d is formed on the back surface of the substrate 11. The back-surface electrode 18d is formed across the SG-DFB region A, the CSG-DBR region B, the optical absorption region C, and the SOA region D.

The end surface films 11a and 11b are AR films having a refractive index of 1% or less and have a property whereby the end surface substantially becomes non-reflective. The AR film has a configuration in which, for example, $MgF_2$ and TiON are alternately stacked. The end surface film 11b may be formed of a reflection film that has a significant reflection rate. In that case, it is possible to suppress leakage of light to the outside from the end surface film 11b. The significant reflection rate is, for example, 10% or more.

A diffraction grating 12a is formed at several sections at predetermined intervals in the lower cladding layer 12 of the SG-DFB region A and the CSG-DBR region B. That is, the SG-DFB region A and the CSG-DBR region B have a sampled grating. The diffraction grating 12a is formed of a material having a refractive index different from that of the lower cladding layer 12. When the lower cladding layer 12 is an InP layer, as the material of the diffraction grating 12a, for example, $Ga_{0.22}In_{0.78}As_{0.47}P_{0.53}$ may be used.

The pitch of the diffraction grating 12a of the SG-DFB region A (interval between corrugations) and the pitch of the diffraction grating 12a of the CSG-DBR region B may be the same or different along the optical axis. In the present example, the pitches are the same. Moreover, one segment is formed by one diffraction grating 12a and one space contiguous therewith (a region where the diffraction grating 12a is absent). A portion occupied by the diffraction grating 12a in each segment (diffraction grating portion) may have the same length or different length along the optical axis. Moreover, each diffraction grating portion of each segment may have the same length in the SG-DFB region A, the diffraction grating portion of each segment may have the same length in the CSG-DBR region B, and the lengths of the diffraction grating portions may be different in the SG-DFB region A and the CSG-DBR region B. The optical property of the sampled grating of the CSG-DBR region B gives a plurality of periodic reflection peaks. Meanwhile, the sampled grating of the SG-DFB region A gives a plurality of periodic optical gain peaks. The position (frequency) of both peaks depends on power supplied to the heaters of the regions (heater power) and the temperature of the sampled gratings due to heat of the heaters. Therefore, adjustment of the heater power enables frequency matching between one reflection peak and one gain peak. In this case, the t-LD 10 oscillates at the substantially matched frequency.

In the SG-DFB region A, the optical length of each segment is substantially the same. Meanwhile, in the CSG-DBR region B, the optical lengths of at least two segments are formed to be different. With this configuration, each intensity of the reflection peaks by the sampled grating of the CSG-DBR region B indicates frequency dependency. Adjustment of the temperature of the heater of the CSG-DBR region B enables selection of a reflection peak that indicates the maximum intensity. Accordingly, it is possible to increase selectivity of frequency of the t-LD 10.

An overview of control of the t-LD device 1 according to the present embodiment is described below with reference again to FIG. 2.

<A. Creation of Look-Up-Table (LUT)>

An operation described below is performed with the TEC 30 being maintained at a certain temperature $T_{ref}$. The frequency locker 20 indicates a sine wave output property illustrated in FIG. 2 regardless of its temperature. Here, the period of sine wave is set to 50 GHz (one of standards of DWDM that achieves 100 channels in a band region of 192 to 197 THz) through adjustment of a difference between the branched waveguide lengths. That is, FSR is set to 50 GHz by adjustment of a difference of the waveguide length of the hybrid element 21.

For efficient operation of a frequency-locked feedback loop (hereinafter simply the "feedback loop") constituted by the frequency locker 20 including the hybrid element 21, the t-LD 10, and the controller 50, it is required to have a large gain of the constituent elements that constitute the feedback loop. For example, even when a feedback loop in which an operation point (oscillation frequency) is set to around the maximum (minimum) output of the frequency locker 20, because the efficiency (output/frequency) of the frequency locker 20 is small, the locking operation for which the feedback loop is designed cannot be carried out. For stable operation of the feedback loop, it is important to lock the frequency at the maximum efficiency of the output property of the frequency locker 20. As illustrated in FIG. 2, because the output property of the frequency locker 20 is close to a sine wave, the maximum efficiency is a median of the maximum and the minimum. That is, lock points indicated by white circles illustrated in FIG. 2 have the aforementioned maximum efficiency. The frequency at this point is defined, for example, as $f_0^{(i)'}$ [Hz]. Once the temperature of the TEC 30 is determined, the output property (output-frequency) illustrated in FIG. 2 is maintained.

A bias current is fed to the t-LD 10 to cause the t-LD 10 to emit light in practice. Then, the power supplied to the heaters (1 to 5) is adjusted, and the output of the t-LD 10 is set to a value that is close to $f_0^{(i)'}$ as far as possible. The output of the t-LD 10 may not necessarily match $f_0^{(i)'}$. At this point of time, the feedback loop is not operated. Moreover, a bias current is not a value that is applied in a state where the t-LD 10 is practically used, but is a value at which the t-LD 10 can emit light enough and the oscillation frequency can be distinguished clearly. The purpose is to suppress the generation of heat of the t-LD 10 due to the bias current as much as possible. Then, the actual oscillation frequency $f_0^{(i)}$ [Hz], the initial values of the power supplied to the heaters (1 to 5) ($P_k^{(i)}$ [W], k=1 to 5), and output values $sPD_1$ and $sPD_3$ of the two control signals output from the frequency locker 20 are recorded on the storage device 52 as a control data set. This control data set uses the output of the first PD 22a. The output value of the PD itself is influenced by the level of the bias current and a temporal change of the t-LD 10. Accordingly, it is also effective to hold the value ($nPD_1^{(i)}=sPD_1^{(i)}/sPD_3^{(i)}$) obtained when the output value sPD$_1^{(i)}$ of the first PD 22a is normalized by the output value sPD$_3^{(i)}$ of the third PD 22c as a control data set.

Furthermore, after the oscillation frequency is stabilized at f$_0^{(i)}$, a change rate of the oscillation frequency of the t-LD 10 with respect to the power supplied to the respective heaters and their inverses C$_{HTk}^{(i)}$ [W/Hz] are obtained. The inverses C$_{HTk}^{(i)}$ are obtained, for example, by using the oscillation frequency obtained when the power supplied to each of the heaters is changed a predetermined amount (e.g., about 1% of P$_k^{(i)}$, for example). Similarly, a change rate of the oscillation frequency of the t-LD 10 with respect to the temperature change of the TEC 30 and its inverse C$_{LD}^{(i)}$ [K/Hz] are obtained. The inverse C$_{LD}^{(i)}$ is obtained, for example, by using the oscillation frequency obtained when the temperature of the TEC 30 is changed, for example, by 1K. Moreover, in a state where the oscillation frequency is stabilized at f$_0^{(i)}$ and the feedback loop is activated, the temperature coefficient of the two control signals output from the frequency locker 20 and its inverse C$_{LOCK}^{(i)}$ [K/Hz] are obtained. The inverse C$_{LOCK}^{(i)}$ is obtained, for example, by using a change amount (temperature coefficient of the oscillation frequency of the t-LD 10) of the oscillation frequency of the t-LD 10 obtained when the temperature of the TEC 30 is changed, for example, by 1K in a state where the feedback loop is activated. Because the feedback loop is activated, the oscillation frequency of the t-LD 10 changes such that the output (or its normalized value) of the first PD 22a is constant regardless of its state (heater power or the like). The change of the oscillation frequency exactly corresponds to the temperature dependency of the output property of the frequency locker 20. Furthermore, in a state where the feedback loop is not activated, the output (or its normalized value) of the first PD 22a is changed. Inverses C$_{PDm}^{(i)}$ [1/Hz] (k=1, 2) of the change amount at that time are also obtained. Both of the change of the heater power and the temperature change of the TEC 30 influence to the change of the oscillation frequency of the t-LD 10. The change rate of the output (its normalized value) of the first PD 22a with respect to the oscillation frequency can be acquired as a statistic amount of all events. The aforementioned obtained change rate, temperature coefficient, and change amount, and the inverses C$_{HTk}^{(i)}$, C$_{LD}^{(i)}$, C$_{LOCK}^{(i)}$, C$_{PDm}^{(i)}$ are stored in the storage device 52 as part of the control data set of the practical oscillation frequency f$_0^{(i)}$.

The same manipulation is performed on the output of the second PD 22b. The heater power is adjusted, and the oscillation frequency of the t-LD 10 reaches to a value close to f$_0^{(i+1)}$', which is far from f$_0^{(i)}$ by 12.5 GHz. Then, the actual oscillation frequency f$_0^{(i+1)}$ at that time, the heater power (initial values) P$_k^{(i+1)}$, and the output (nPD$_2^{(i+1)}$= sPD$_2$/sPD$_3$) of the second PD 22b are stored in the storage device 52 as the control data set of the oscillation frequency f$_0^{(i+1)}$. In addition, each of the obtained C$_{HTk}^{(i+1)}$, C$_{LD}^{(i+1)}$, C$_{LOCK}^{(i+1)}$, C$_{PDm}^{(i+1)}$ is also stored in the storage device 52 as part of the control data set of the actual oscillation frequency f$_0^{(i+1)}$.

The above manipulation is performed on all lock points (for example, 400 lock points are present in the region of 192 to 197 THz) set at 12.5 GHz interval to complete the LUT. That is, the LUT includes a plurality of reference frequencies and a control data set for each of the plurality of reference frequencies. The LUT is stored in the storage device 52 of the controller 50 before shipping of the t-LD device 1.

FIG. 4 is a table listing control data sets held on the LUT. As described above, the inverse C$_{LOCK}$ of the temperature property of the output of the frequency locker, the inverse C$_{LD}$ of the temperature property of the oscillation frequency of the t-LD 10, the inverses C$_{HTk}$ of the coefficient of the oscillation frequency of the t-LD 10 with respect to the heater power, and the inverses C$_{PDm}$ of the oscillation frequency dependency of the output of the PD are stored in the storage device 52. Thus, when the actual locking operation of the oscillation frequency of the t-LD 10 described below is performed, it is possible to quicken the control sequence of the controller 50. That is, the calculation in the controller 50 can be simplified. Accordingly, each of the control data sets includes, not only the aforementioned temperature property, coefficient, and oscillation frequency dependency, but also their inverses. The control data sets may not include the aforementioned temperature property, coefficient, or oscillation frequency dependency, but may include their inverses.

In the aforementioned example, a mode in which the temperature T$_{ref}$ of the TEC 30 is constant in all channels is adopted. However, particularly, in a channel close to the maximum/minimum, when the temperature Tref set at a central part is maintained, the level of the heater power may be excessively large/small when the t-LD 10 is oscillated at a target channel frequency. The aforementioned LUT may be created by changing the temperature of the TEC 30 from T$_{ref}$ in case of such a case. In this case, regarding the output property of the hybrid element 21, the channel frequency is tend to be shifted from a point near the median when the temperature is changed, however, the feedback loop is activated stably without excessively approaching the maximum/minimum point of the output. Moreover, when close to the maximum/minimum point, it is possible to cope with this case by switching two outputs of the hybrid element 21. Because the two outputs are different in phase by 90°, when one of the two outputs is close to the maximum/minimum, the other of the two outputs is close to the median. The above description is based on the assumption that the two outputs are adopted alternately, but information as to which output to adopt may be held on the LUT.

<B. Actual Operation of the t-LD 10>

Next, an algorithm for operating the t-LD 10 at a target oscillation frequency is described below. Note that it is very rare that the t-LD 10 matches any channel frequency set on the LUT without use of the below-indicated algorithm.

Figure 5:
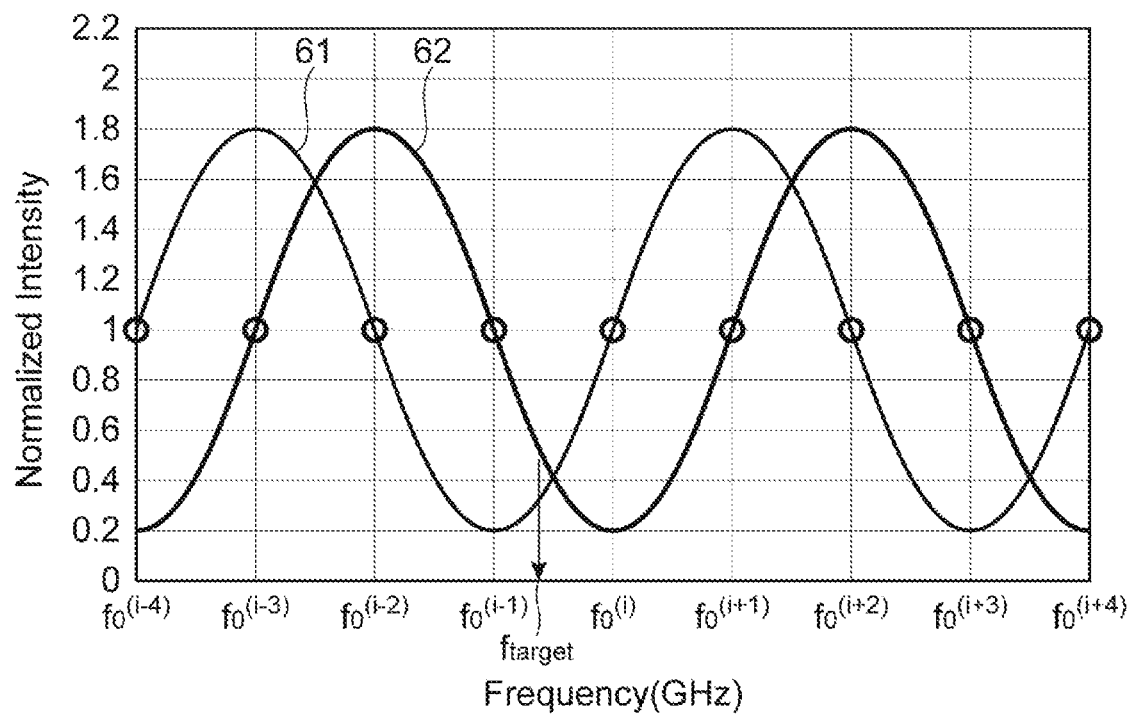
FIG. 5 is a graph illustrating target oscillation frequency $f_{target}$ of FIG. 2.

(1) The controller 50 obtains information of the target oscillation frequency (f$_{target}$) from a system. FIG. 5 is a graph indicating the target oscillation frequency of FIG. 2. In FIG. 5, the target oscillation frequency is indicated by the arrow.

(2) Next, the controller 50 defines a channel having a reference frequency closest to the target oscillation frequency f$_{target}$ from among reference frequencies f$_0^{(i)}$(i=1 to N) stored in the LUT. In FIG. 5, a lock point closest to the target oscillation frequency f$_{target}$ is positioned at (i−1). Therefore, the channel having the defined reference frequency is (i−1). Next, control data set regarding the channel defined from the LUT are all read. The channel stored in the LUT also stores information (PD selection information) as to which of the first PD 22a and the second PD 22b to use as a reference. Therefore, the controller 50 also reads the PD selection information. In the example below, the second PD 22b is selected.

(3) Next, a difference Δf [Hz] between the reference frequency of the defined channel and the target oscillation frequency f$_{target}$ is defined (calculated) as Formula 1 below. That is, the after the target oscillation frequency f$_{target}$ is obtained and the reference frequency $f_0^{(i)}$ is selected, $\Delta f$ is determined. In Formula 1 below, n is a natural number in a range of 1 to N.

$$\Delta f = f_{target} - f_0^{(n)} \quad \text{[Formula 1]}$$

Figure 6:
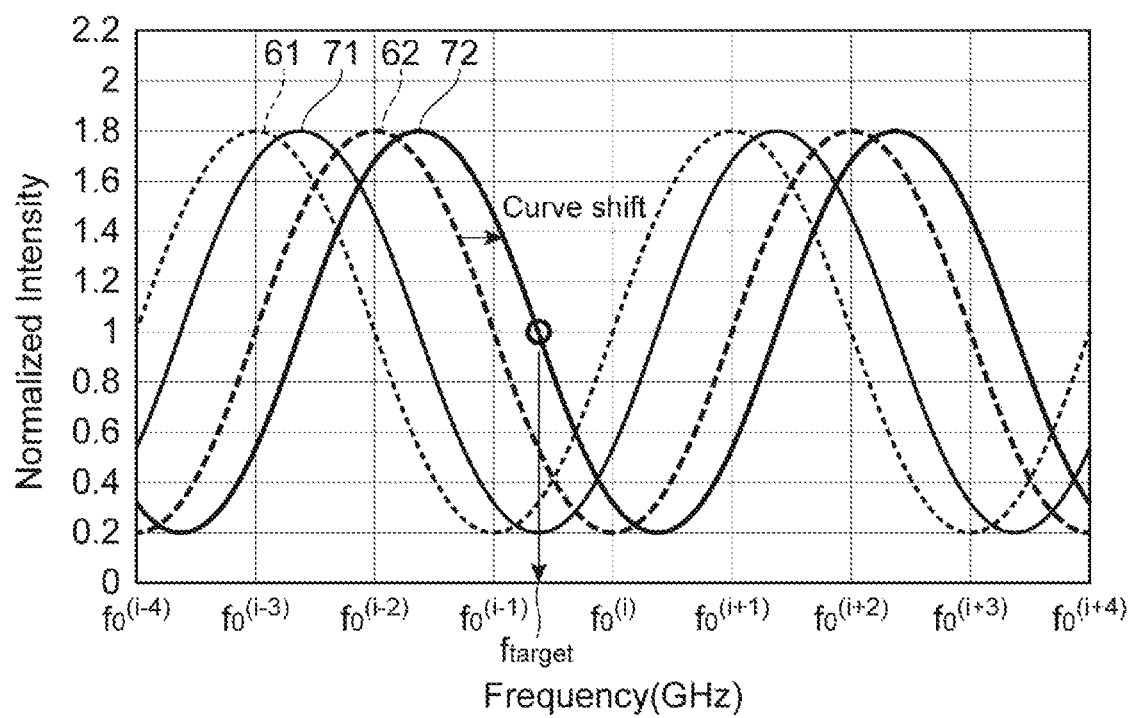
FIG. 6 is a graph illustrating an output property of a frequency locker of FIG. 2 and an output property thereof after shifting.

(4) Next, a temperature to be set on the TEC 30 is calculated. If the temperature of the TEC 30 is $\text{Tref}^{(n)}$ [K] and the initial values of the heater power of the t-LD 10 are $P_k^{(n)}$ [W](k=1 to 5), the output value of the first PD 22a normalized by using the output of the third PD 22c must be about 1.0. However, this output value, i.e., about 1.0, can be obtained when a target oscillation frequency matches the reference frequency. Therefore, the output value of the target oscillation frequency $f_{target}$ is naturally a value that is shifted from about 1.0. In this case, the feedback control of the frequency locking is difficult to be operated stably. Thus, from a viewpoint that the feedback control is stably operated even at the target oscillation frequency $f_{target}$, the output property of the frequency locker 20 (technically, the hybrid element 21) is shifted such that the output value becomes about 1.0 at the target oscillation frequency $f_{target}$. For example, as illustrated in FIG. 6, by adjustment of the temperature of the TEC 30, the output property of the second PD 22b is shifted from the graph 62 indicated by the dotted line to the graph 72 indicated by the solid line. In this process, a temperature change amount $\Delta T_{TEC}$ of the hybrid element 21 is defined as Formula 2 below. Then, the resultant $\Delta T_{TEC}$ is used to determine temperature $T_{NEW}$ to which the TEC 30 is set along Formula 3 below, and the temperature of the TEC 30 becomes $T_{NEW}$. That is, the temperature of the TEC 30 is set to and maintained at $T_{NEW}$. When the temperature of the TEC 30 is stable at $T_{NEW}$, the output property of the second PD 22b becomes those given by the graph 72 indicated in FIG. 6.

$$\Delta T_{TEC} [K] = \Delta f [Hz] \times C_{LOCK}^{(i-1)} [K/Hz] \quad \text{[Formula 2]}$$

$$T_{NEW} = T_{REF}^{(i-1)} + \Delta T_{TEC} \quad \text{[Formula 3]}$$

(5) Next, the initial values with respect to the heaters 19 are corrected such that the t-LD 10 oscillates at the target oscillation frequency $f_{target}$. If the oscillation frequency of the t-LD 10 is not temperature-dependent, initial values $P_k$ (k=1 to 5) of the supply power to the heaters 19 for the t-LD 10 to oscillate at the target oscillation frequency $f_{target}$ are corrected as Formula 4 with respect to the initial values $P_k^{(i-1)}$ of the heater power at the reference frequency $f_0^{(i-1)}$.

$$P_k [W] = P_k^{(i-1)} [W] + C_{HTk}^{(i-1)} [W/HZ] \times \Delta f [Hz] \quad \text{[Formula 4]}$$

However, when the temperature of the TEC 30 is changed, the oscillation frequency of the t-LD 10 is also naturally changed. When the hybrid element 21 is formed, for example, of silicon photonics, the temperature coefficient of the hybrid element 21 is −9 GHz/K. Meanwhile, when the t-LD 10 is formed mainly of InP, the temperature coefficient of the oscillation frequency of the t-LD 10 is −13 GHz/K. At the aforementioned initial values $P_k^{(n)}$ of the heater power, the temperature property (temperature coefficient) of the t-LD 10 is not taken into account. Therefore, there is a possibility that the oscillation frequency of the t-LD 10 deviates from the FSR/4 region. Accordingly, in the present embodiment, Formula 5 below is used to estimate the initial values of the heater power that takes into account the shift of the oscillation frequency of the t-LD 10 due to a temperature change of the TEC 30. The third term on the right hand of Formula 5 below corresponds to the correction term that takes into account the temperature property of the t-LD 10. The temperature coefficient of the hybrid element 21 indicates the amount of shift of frequency of the output property (transmission spectrum) of the hybrid element 21 at a time when the temperature of the TEC 30 is changed by 1K. The temperature coefficient of the hybrid element 21 indicates a degree of a temperature variation of the transmission spectrum of the hybrid element 21 and corresponds to the temperature coefficient of the control signal output from the frequency locker 20.

$$P_k^{new}[W] = P_k^{(i-1)}[W] + C_{HTk}^{(i-1)}[W/Hz] \times \Delta f [Hz] - \quad \text{[Formula 5]}$$

$$C_{HTk}^{(i-1)}[W/Hz] \times \Delta T[K]/C_{LD}^{(i-1)}[K/Hz] =$$

$$P_k^{(i-1)} + C_{HTk}^{(i-1)} \times \{1 - C_{LOCK}^{(i-1)}/C_{LD}^{(i-1)}\} \times \Delta f$$

(6) Next, the power $P_k^{new}$ estimated by Formula 5 above is supplied to each of the heaters, and a bias current is fed to the SG-DFB region A and the SOA region D of the t-LD 10. Specifically, current is fed to each of the heaters such that the heater power becomes $P_k^{new}$. As described above, the value of the bias current in the present process is a value for only stable operation of the feedback loop (i.e., a value to such an extent that the oscillation frequency can be clearly distinguished). At this point of time, the oscillation frequency of the t-LD 10 is very close to the target oscillation frequency $f_{target}$. Then, the light oscillated from the t-LD 10 is extracted, and a feedback loop is formed between the frequency locker 20 and the controller 50. Then, the oscillation frequency of the t-LD 10 converges to the target oscillation frequency $f_{target}$.

Figure 7:
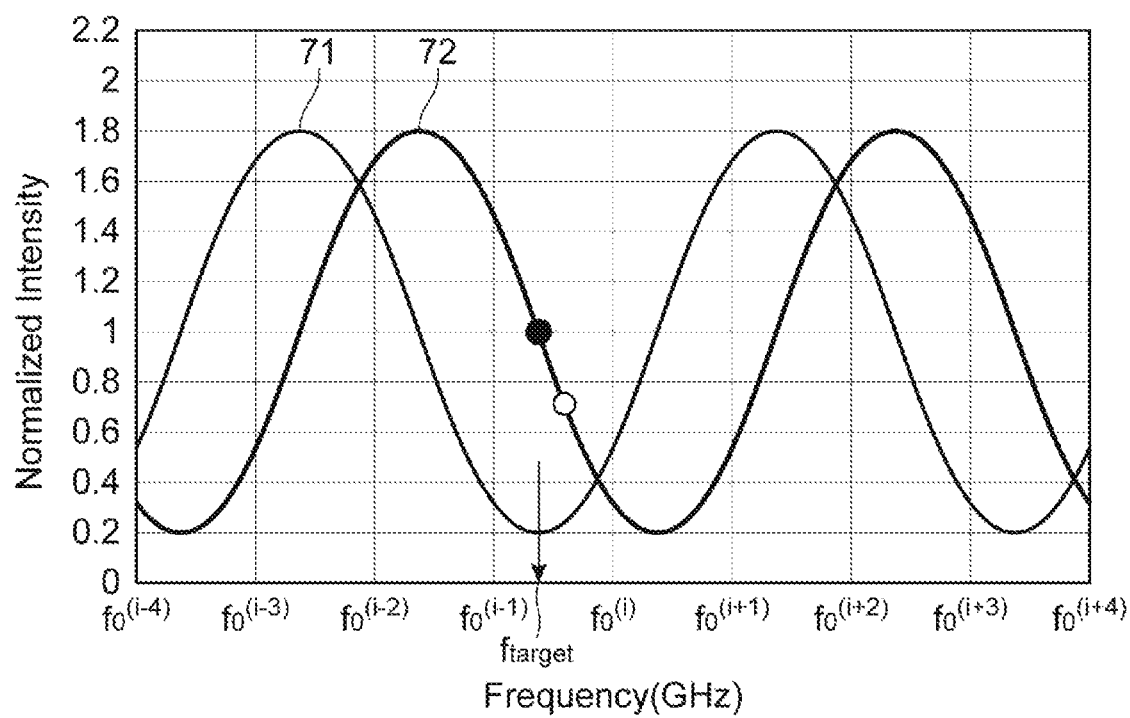
FIG. 7 is a graph illustrating an output property of a frequency locker after correction.

(7) FIG. 7 is a graph indicating the output property of the frequency locker 20 after correction. The reference frequency defined in the process (1) above is $f_0^{(i-1)}$, but as illustrated in FIG. 7, when the heater power $P_k$ is fed, the oscillation frequency is shifted to the reference frequency $f_0^{(i)}$ side with respect to the target oscillation frequency $f_{target}$ as indicated, for example, by white circle. If the oscillation frequency of the t-LD 10 is not temperature-dependent, when the heater power is corrected as indicated by Formula 4, the t-LD 10 is expected to be stable in a very close vicinity of the target oscillation frequency $f_{target}$. However, in practice, the t-LD 10 has temperature property. Therefore, the oscillation frequency of the t-LD 10 exceeds the target oscillation frequency $f_{target}$ and becomes close to the reference frequency $f_0^{(i)}$. When the heater power is corrected to the value calculated by Formula 4 above, the oscillation frequency can be further close to or exceed the reference frequency $f_0^{(i)}$.

In contrast, in the present embodiment, correction that takes into account the influences of the t-LD 10 in association with a temperature change of the TEC 30 is carried out. Specifically, the heater power is corrected to the value calculated by Formula 5. Thus, the initial oscillation frequency of the t-LD 10 can be kept very near the target oscillation frequency $f_{target}$. Then, when the feedback loop is performed on the heater power, the oscillation frequency of the t-LD 10 can be eventually stabilized at the target oscillation frequency $f_{target}$. For example, the feedback loop to the heaters 19 increases or decreases heater power $\Delta P_k$ calculated by Formula 6. $\Delta PD_2$ included in Formula 6 is a difference between the normalized output value of the second PD 22b and the normalized output value (1.0 according to the aforementioned series of processes) at the target oscillation frequency. In the present process, until the normalized output value of the second PD 22b becomes 1.0, the adjustment of the heater power is repeated.

$$\Delta P_k = \Delta PD_2 \times C_{HTk}^{(i-1)}/C_{PD2}^{(i-1)} \quad \text{[Formula 6]}$$

After the oscillation frequency of the t-LD 10 converges the target oscillation frequency, APC (Auto-Power Control) with respect to the output of the third PD 22c is performed on the t-LD 10 with respect to the bias current. At this time, the aforementioned frequency-locked feedback loop is also performed concurrently. Because the t-LD 10 has the SOA region D, the APC is performed on the SOA region D.

In the t-LD device 1, which is a wavelength-tunable light source according to the present embodiment described above, both the t-LD 10 and the frequency locker 20 are mounted on a single TEC 30. Therefore, as compared with the case where the t-LD 10 and the frequency locker 20 are mounted on different TECs, the miniaturization of the t-LD device 1 can be reached. Moreover, the t-LD device 1 includes the controller 50 that controls the heaters 19 included in the t-LD 10 and the TEC 30. For example, as described above, the controller 50 obtains target oscillation frequency $f_{target}$ and selects a reference frequency closet to the target oscillation frequency $f_{target}$ from among reference frequencies $f_0^{(n)}$, which are preliminarily stored. In addition, in the present embodiment, one of the two control signals corresponding to the reference frequency is selected. Then, the output property of the frequency locker 20 is shifted by adjustment of the temperature of the TEC 30 using Formulae 1 to 3. Thus, the lock point matches the target oscillation frequency. Here, when the temperature of the TEC 30 is changed, the oscillation frequency of the t-LD 10 is also changed. Therefore, correction values of the heater power are calculated using Formula 5 above. When the correction values are supplied to the respective heaters 19, the oscillation frequency of the t-LD 10 can be brought close to the target oscillation frequency at a time before the feedback control is performed. Thus, even when the single TEC 30 is used for the t-LD 10 and the frequency locker 20, by carrying out correction of the heater power in accordance with a temperature change of the TEC 30, the time taken until the oscillation frequency of the t-LD 10 becomes stable at the target oscillation frequency $f_{target}$ can be shortened.

In the present embodiment, the controller 50 may include a look-up table (LUT), the LUT may include a plurality of reference frequencies and a control data set for each of the plurality of reference frequencies, each of the control data sets may include a setting temperature of the TEC 30, a temperature coefficient of two control signals with respect to the temperature of the TEC 30, a temperature coefficient of the oscillation frequency of the t-LD 10 with respect to the temperature of the TEC 30, power supplied to each of the heaters 19, a change rate of the oscillation frequency of the t-LD 10 with respect to each of the heater power, and an output value for each of the two control signals. In this case, the calculation time of the controller 50 can be shortened. Therefore, the time taken until the oscillation frequency of the t-LD 10 becomes stable at the target oscillation frequency can be shortened favorably.

In the present embodiment, the frequency locker 20 may include the hybrid element 21 formed of a semiconductor, and the hybrid element 21 may output two control signals. In this case, the frequency of the two control signals can be easily shifted by a temperature change of the TEC 30.

(Modification)

Next, a modification of the embodiment is described. In the description of the modification, a description that is described in the embodiment is omitted, and parts different from the embodiment are described.

When receiving a command of setting or changing the oscillation frequency from a system, the t-LD device 1 performs convergence operation toward a new target oscillation frequency on the basis of the processes described in the embodiment. Here, in a case that the ambient temperature of the t-LD device 1 at a time when the LUT is created differs from the actual ambient temperature during operation, even when the control data set held in the LUT is applied to the TEC 30 and the t-LD 10, the precondition of ambient temperature is different. Therefore, the correspondence relationship of the control data set $\{T_{ref}, C_{LOCK}^{(i)}, C_{LD}^{(i)}, P_k^{(i)}, C_{HTk}^{(i)}, sPD_m^{(i)}, C_{PDm}^{(i)}\}$ corresponding to the reference frequency $f_0^{(i)}$ may be no longer satisfied. Therefore, there may be a problem that, even when the control data set is set, the oscillation frequency of the t-LD 10 does not converge to the reference frequency $f_0^{(i)}$. The ambient temperature of the t-LD device 1 mainly corresponds to the temperature of a package of the t-LD device 1.

In the modification, in view of the aforementioned problem, the influence of the ambient temperature change is reflected to the temperature $T_{NEW}$ of the TEC 30 and the initial values $P_k^{new}$ of the power supplied to the heaters. For example, after $\Delta f$ is determined similar to the embodiment, the temperature $T_{new}$ of the TEC 30 and the initial values $P_k^{new}$ of the power that take into account the influence of the ambient temperature change are calculated. As a specific example, first, the ambient temperature of the t-LD device 1 at a time when the LUT is created is defined as $T_{CAL}$ and the current ambient temperature of the t-LD device 1 is defined as $T_{MON}$. Moreover, in order to take into account the ambient temperature dependency of the output property of the hybrid element 21, an inverse of the ambient temperature dependency of the output property of the hybrid element 21 is defined as $C_{LOCK\_AMB}^{(i)}$ [K/Hz]. Here, the ambient temperature of the t-LD device 1 is obtained by the temperature sensing element 32. Then, the temperature of the TEC 30 is estimated using Formula 7 that further introduces a correction term with respect to Formula 3. In addition, the initial values of the heater power are estimated using Formula 8 that further introduces a correction term with respect to Formula 5. Thus, even when the precondition of ambient temperature is different, the initial oscillation frequency of the t-LD 10 can be set close to the target oscillation frequency, and thus the feedback control can be carried out unfailingly. Accordingly, even when the precondition of ambient temperature is different, the oscillation frequency of the t-LD 10 can converge to the target oscillation frequency $f_{target}$. $C_{LOCK\_AMB}^{(i)}$ can correspond to the inverse of the ambient temperature dependency of the control signal output from the frequency locker 20.

$$T_{new} = T_{REF}^{(i-1)} + \Delta f \times C_{LOCK}^{(i-1)} + (T_{MON} - T_{CAL}^{(i-1)})/C_{LOCK\_AMB}^{(i-1)}$$ [Formula 7]

$$P_k^{new} = P_k^{(i-1)} + C_{HTk}^{(i-1)} \times 1 - C_{LOCK}^{(i-1)}/C_{LOCK\_AMB}^{(i-1)} - C_{HTk}^{(i-1)} \times (T_{MON} - T_{CAL}^{(i-1)})/C_{LOCK\_AMB}^{(i-1)}$$ [Formula 8]

Furthermore, in the modification, the ambient temperature dependency of the oscillation frequency of the t-LD 10 may be taken into account. For example, the inverse of the ambient temperature dependency of the oscillation frequency of the t-LD 10 (i.e., inverse of the temperature coefficient of the oscillation frequency of the t-LD 10 with respect to the ambient temperature) is defined as $C_{LD\_AMB}^{(i)}$ [K/Hz]. Then, the initial values of the heater power may be estimated using Formula 9 that further introduces a correction term with respect to Formula 8. In this case, the oscillation frequency of the t-LD 10 can converge to the target oscillation frequency $f_{target}$ more unfailingly.

$$P_k^{new} = P_k^{(i-1)} + C_{HTk}^{(i-1)} \times \{1 - C_{LOCK}^{(i-1)}/C_{LD}^{(i-1)}\} \times \Delta f - C_{HTk}^{(i-1)} \times (T_{MON} - T_{CAL}^{(i-1)})/C_{LOCK\_AMB}^{(i-1)} + C_{HTk}^{(i-1)} \times (T_{MON} - T_{CAL}^{(i-1)})/C_{LD\_AMB}^{(i-1)}$$ [Formula 9]

$C_{LOCK\_AMB}^{(i)}$ can be determined from a change rate of the oscillation frequency of the t-LD 10 at a time when the ambient temperature is changed under the condition that the TEC 30 and the t-LD 10 are set to the control data set of $f_0^{(i)}$ and the feedback control is performed. $C_{LD\_AMB}^{(i)}$ can be determined from a change rate of the oscillation frequency of the t-LD 10 at a time when the ambient temperature is changed under the condition that the TEC 30 and the t-LD 10 are set to the control data set of reference frequency $f_0^{(i)}$ and the t-LD 10 is oscillated without the feedback control. When the influence of the ambient temperature change is taken into account, the LUT is configured as described in the table illustrated in FIG. 8. From a viewpoint of efficiency of calculation by the controller 50, $C_{LOCK\_AMB}^{(i)}$ and $C_{LD\_AMB}^{(i)}$ are held as inverses similar to $C_{LD}^{(i)}$ in the storage device 52, but may not be inverses depending on the case. In the table illustrated in FIG. 8, an example in which $T_{CAL}^{(i)}$ is separately held is illustrated. When the ambient temperature at a time when the series of control data sets is created is not substantially changed, single $T_{CAL}$ may be held.

In the modification, after the initial values of the heater power are estimated by one of Formulae 8 and 9, similar to the embodiment, the feedback control may be performed on the heater power and the APC may be performed on the t-LD 10. In this case, similar to the embodiment, the oscillation frequency of the t-LD 10 can be stabilized at the target oscillation frequency $f_{target}$.

The wavelength-tunable light source and the wavelength control method according to the present disclosure are not limited to the embodiment or the modification, but other various modifications may be made. For example, in the embodiment and the modification, as illustrated in FIG. 1, the frequency locking operation is performed with reference to the front light of the t-LD, but is not limited thereto. Moreover, in the embodiment and the modification, the t-LD device includes the temperature sensing element 32, but is not limited thereto. For example, the element for sensing the ambient temperature of the t-LD device may not be included in the t-LD device.

Figure 9:
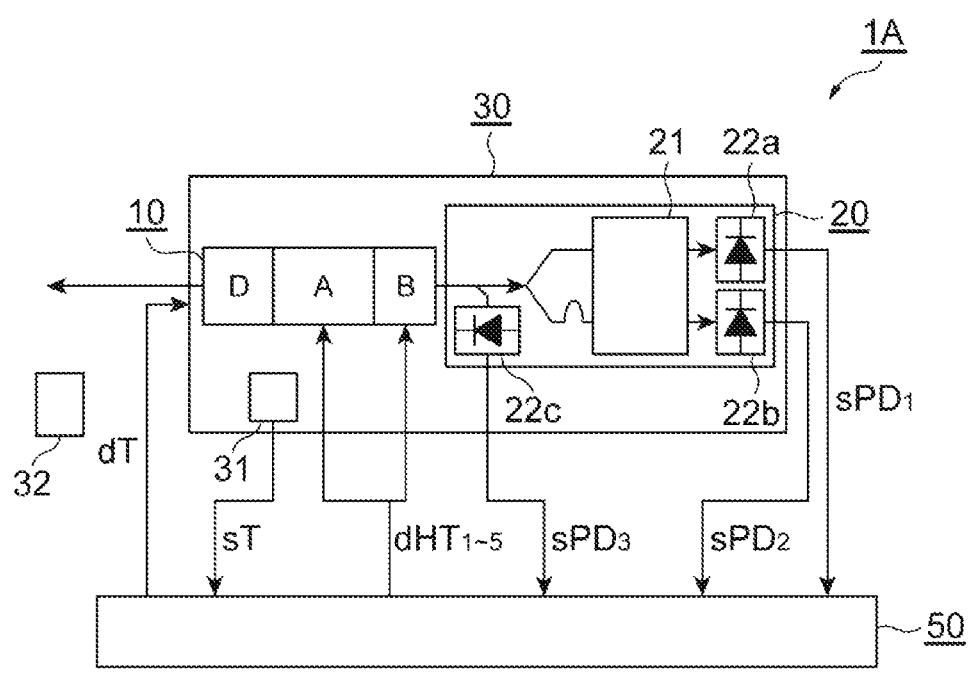
FIG. 9 is a schematic view illustrating an example of another t-LD device.

FIG. 9 is a schematic view illustrating an example of another t-LD device. A t-LD device 1A illustrated in FIG. 9 differs from the t-LD device 1 of the embodiment such that the frequency locking operation is performed using back light. Therefore, the frequency locker 20 included in the t-LD device 1A is arranged on the back surface of the t-LD 10. The constituent elements of the t-LD device 1A are similar to those of the t-LD device 1 of the embodiment.

Figure 10:
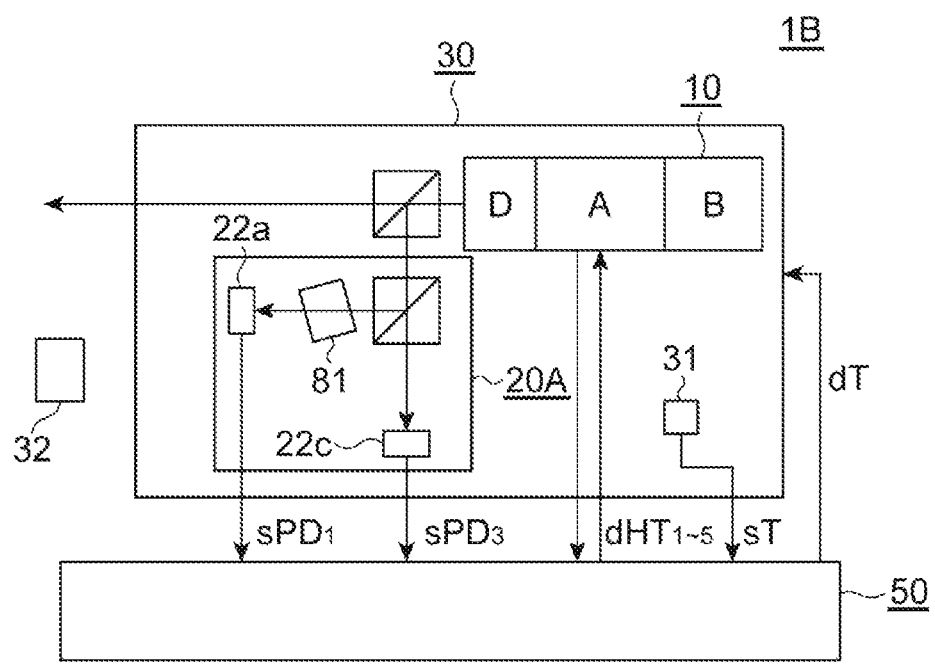
FIG. 10 is a schematic view illustrating an example of still another t-LD device.
Figure 11:
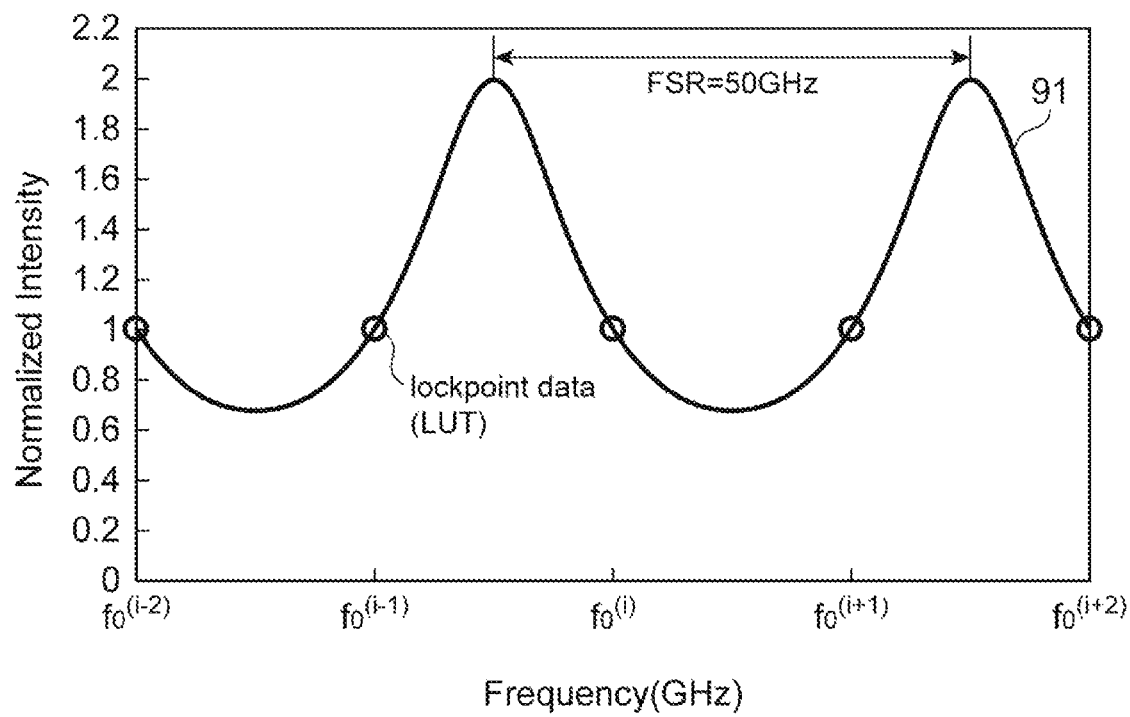
FIG. 11 is a graph illustrating an output property of a frequency locker according to still another example.

In the wavelength control method according to the embodiment and the modification, the frequency locker including the hybrid element and the three PDs is used, and the process of selecting one of the two control signals with respect to the reference frequency is performed, but is not limited thereto. Still another example is described below with reference to FIGS. 10 and 11 in which a frequency locker not including the hybrid element or the three PDs is used. FIG. 10 is a schematic view illustrating a still another example of the t-LD device. FIG. 11 is a graph indicating the output property of the frequency locker of still another example. Note that a description that is described in the embodiment and the modification is omitted.

A frequency locker 20A of a t-LD device 1B illustrated in FIG. 10 differs from the frequency locker 20 of the t-LD device 1 of the embodiment and the t-LD device 1A of another example such that the frequency locker 20A includes an etalon 81 instead of the hybrid element 21. In addition, the frequency locker 20A does not include the second PD 22b. Therefore, from the frequency locker 20A, one transmission spectrum (one control signal) is obtained from the output of the first PD 22a positioned downstream of the etalon 81 by normalized by the output of the third PD 22c that receives raw emission light of the t-LD 10. The etalon 81 is formed of a material showing a temperature property (temperature coefficient) larger than that of the material of a conventional etalon filter. The etalon 81 is formed, for example, of silicon instead of glass, e.g., quartz, which is conventionally used. The temperature coefficient of the etalon 81 indicates the shift amount of frequency of the output property (transmission spectrum) of the etalon 81 at a time when the temperature of the TEC 30 is changed by 1K and corresponds to the temperature coefficient of the control signal output from the frequency locker 20A. For example, the temperature coefficient of the etalon made of silicon is about five times as large as the temperature coefficient of the etalon made of quartz, and the temperature coefficient of quartz is, for example, −1.8 GHz/K and the temperature coefficient of silicon is, for example, −9 GHz/K.

According to the t-LD device 1B, as illustrated in FIG. 11, one control signal is output from the frequency locker 20A. A graph 91 illustrated in FIG. 11 indicates a signal (normalized output) output from the first PD 22a. In the graph 91, lock points are set at intervals of 25 GHz. A LUT of still another example includes a temperature coefficient of the one control signal with respect to the TEC 30. The controller 50 of the t-LD device 1B, similar to the embodiment, selects a reference frequency closest to the target oscillation frequency $f_{target}$ from among a plurality of reference frequencies $f_0^{(n)}$, which is preliminarily stored. Then, the temperature of the TEC 30 is set using Formulae 1 to 3 to shift the output property of the frequency locker 20A. Thus, the graph 91 is shifted, and the lock point matches the target oscillation frequency. Then, the correction values (initial values) of the heater power are calculated using Formula 5. Here, in still another example, the temperature coefficient of the etalon 81 is used for Formula 5 as the temperature coefficient of the control signal. Then, the calculated correction values are supplied to the heaters such that, at a point of time before the feedback control is performed, the oscillation frequency of the t-LD 10 can be brought close to the target oscillation frequency. Then, for example, when the feedback control is performed on the heaters 19 using Formula 6 described above, the t-LD 10 can be stably operated at the target oscillation frequency.

According to the t-LD device 1B described above, the etalon 81 made of a material showing a temperature property larger than that of the conventional etalon filter is included in the frequency locker 20A. Therefore, the output property of the frequency locker 20A can be easily shifted by temperature adjustment of the TEC 30. Thus, as compared with the case where the conventional etalon is used, the lock point can be matched with the target oscillation frequency in a short period of time. Then, according to the t-LD device 1B, a wavelength difference due to a difference in temperature property of the t-LD 10 and the frequency locker 20A can be compensated by the heaters. Accordingly, even when the single TEC 30 is used for the frequency locker 20A and the t-LD 10 such as the t-LD device 1B, as compared with the case where the etalon made of a conventional material is used, the time taken until the t-LD 10 converges to the target oscillation frequency can be shortened. In other words, the t-LD device 1B can provide the same operation and effect as the t-LD devices 1 and 1A. Moreover, the configuration of the t-LD device 1B can be simplified as compared with the t-LD devices 1 and 1A. In addition, the process of selecting one of the two control signals with respect to the reference frequency can be omitted.

A matter described in the embodiment and the modification may be properly applied to another example and still another example described above. For example, at least one of Formulae 7 to 9 may be used in at least one of another example and still another example described above. Moreover, another example and still another example described above may be combined.

What is claimed is:

1. A wavelength control method for a wavelength-tunable light source comprising:
   a wavelength-tunable laser including a first region and a second region each of which includes at least one of heaters;
   a frequency locker configured to receive output light of the wavelength-tunable laser and to output an electric control signal having frequency period with respect to frequency of the output light;
   a thermal electric cooler on which the wavelength-tunable laser and the frequency locker are mounted; and
   a controller configured to include a look-up table, the method comprising:
   acquiring a target oscillation frequency;
   selecting a reference frequency closest to the target oscillation frequency from among a plurality of reference frequencies preliminarily stored in the look-up table;
   calculating $\Delta f$ which is a difference between the target oscillation frequency and the reference frequency;
   calculating temperature $T_{NEW}$ of the thermal electric cooler such that a lock point of the output property of the frequency locker matches to the target oscillation frequency;
   setting and maintaining temperature of the thermal electric cooler to and at the temperature $T_{NEW}$;
   calculating a first power $P_k^{NEW}$ as an initial value such that the oscillation frequency of the wavelength-tunable laser matches to the target frequency, where k is a natural number; and
   supplying each of the heaters with the first power $P_k^{new}$.

2. The wavelength control method according to claim 1, wherein
   the value $T_{NEW}$ is indicated by a formula: $TNEW=T+\Delta f \times C_{LOCK}$, where T is temperature set in the thermal electric cooler at the reference frequency, and $C_{LOCK}$ is an inverse of a temperature coefficient of the electric control signal output from the frequency locker, and
   the first power $P_k^{new}$ is indicated by a formula: $P_k^{new}=P_k+C_{HTk} \times (1-C_{Lock}/C_{LD}) \times \Delta f$, where $P_k$ is power supplied to a corresponding heater from among the heaters at the reference frequency, $C_{HTk}$ are inverses of a change rate of oscillation frequency of the wavelength-tunable laser with respect to the power supplied to the respective heaters, and $C_{LD}$ is an inverse of a change rate of the oscillation frequency of the wavelength-tunable laser which changes depending on a temperature change of the thermal electric cooler.

3. The wavelength control method according to claim 2, wherein in the setting temperature of the thermal electric cooler, a value obtained by adding $(T_{MON}-T_{CAL})/C_{LOCK\_AMB}$ from the value $T_{NEW}$ is regarded as the temperature of the thermal electric cooler, and
   in the supplying each of the heaters with the initial value, a value obtained by subtracting $C_{HTk} \times (T_{MON}-T_{CAL})/C_{LOCK\_AMB}$ from the first power $P_k^{new}$ is regarded as the initial value, where $T_{MON}$ is a current ambient temperature of the wavelength-tunable light source, $T_{CAL}$ is an ambient temperature of the wavelength-tunable light source at a time when the look-up table is created, and $C_{LOCK\_AMB}$ is an inverse of a change rate of the electric control signal output from the frequency locker with respect to an ambient temperature of the wavelength-tunable light source.

4. The wavelength control method according to claim 2, wherein
   in the setting temperature of the thermal electric cooler, a value obtained by adding $(T_{MON}-T_{CAL})/C_{LOCk\_AMB}$ from the value $T_{NEW}$ is regarded as the temperature of the thermal electric cooler, and
   in the supplying each of the heaters with the initial value, a value obtained by subtracting $C_{HTk} \times (T_{MON}-T_{CAL})/C_{LOCK\_AMB}$ from the first power $P_k^{new}$ and adding $C_{HTk} \times (T_{MON}-T_{CAL})/C_{LOCK\_AMB}$ is regarded as the initial value, where $T_{MON}$ is a current ambient temperature of the wavelength-tunable light source, $T_{CAL}$ is an ambient temperature of the wavelength-tunable light source at a time when the look-up table is created, $C_{LOCK\_AMB}$ is an inverse of a change rate of the electric control signal output from the frequency locker with respect to an ambient temperature of the wavelength-tunable light source, and $C_{LD\_AMB}$ is an inverse of temperature coefficient of an oscillation frequency of the wavelength-tunable laser with respect to an ambient temperature of the wavelength-tunable light source.

5. The wavelength control method according to claim 1, wherein
   the electric control signals of the frequency locker include two control signals whose phases are mutually different by 90°, the two control signals having frequency period with respect to frequency of the output light of the wavelength-tunable laser, and
   the wavelength control method further comprises:
   selecting one of the two control signals corresponding to the reference frequency.

6. The wavelength control method according to claim 1, further comprising:
   performing feedback control on the first power $P_k^{new}$ to converge the oscillation frequency of the wavelength-tunable laser with the target oscillation frequency.

* * * * *